(12) United States Patent
Lien et al.

(10) Patent No.: US 10,074,418 B2
(45) Date of Patent: *Sep. 11, 2018

(54) SRAM MODULE AND WRITING CONTROL METHOD THEREOF

(71) Applicant: M31 Technology Corporation, Hsinchu County (TW)

(72) Inventors: Nan-Chun Lien, Taipei (TW); David C. Yu, Taoyuan (TW)

(73) Assignee: M31 Technology Corporation, Hsinchu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/836,922

(22) Filed: Dec. 11, 2017

(65) Prior Publication Data

US 2018/0102165 A1    Apr. 12, 2018

Related U.S. Application Data

(63) Continuation of application No. 14/729,853, filed on Jun. 3, 2015, now Pat. No. 9,870,817.

(30) Foreign Application Priority Data

Feb. 6, 2015   (TW) .............................. 104104170 A

(51) Int. Cl.
   *G11C 11/00*      (2006.01)
   *G11C 11/419*     (2006.01)

(52) U.S. Cl.
   CPC ................................ *G11C 11/419* (2013.01)

(58) Field of Classification Search
   CPC ..... G11C 11/00; G11C 11/413; G11C 11/419; G11C 11/4193; G11C 7/00; G11C 11/41; G11C 11/416; G11C 11/417; G11C 11/42
   See application file for complete search history.

(56) References Cited

U.S. PATENT DOCUMENTS

| | | | |
|---|---|---|---|
| 9,870,817 B2* | 1/2018 | Lien | ..................... G11C 11/419 |
| 2004/0100816 A1 | 5/2004 | Forbes | |
| 2008/0037346 A1 | 2/2008 | Houston | |
| 2012/0275242 A1 | 11/2012 | Katoch | |
| 2013/0003443 A1 | 1/2013 | Houston | |
| 2013/0077387 A1 | 3/2013 | Yabuuchi | |

(Continued)

FOREIGN PATENT DOCUMENTS

| | | |
|---|---|---|
| CN | 103021454 A | 4/2013 |
| CN | 103943141 A | 7/2014 |

(Continued)

*Primary Examiner* — Hien Nguyen
(74) *Attorney, Agent, or Firm* — Winston Hsu

(57) ABSTRACT

A SRAM module and a writing control method of the SRAM module are disclosed. The writing control method of the SRAM module is applied to a SRAM module that includes a plurality of memory cells and a bit line. The method includes: providing a first voltage as a supply voltage of the plurality of memory cells during a data retention time; decreasing a first voltage level corresponding to the data retention time of the memory cells to a second voltage level by discharging the memory cells; and performing a write process to the memory cells through the bit line. The discharge time from the first voltage level to the second voltage level is related to the number of the memory cells.

20 Claims, 13 Drawing Sheets

(56) References Cited

U.S. PATENT DOCUMENTS

| | | |
|---|---|---|
| 2014/0177356 A1 | 6/2014 | Su |
| 2014/0184162 A1 | 7/2014 | Takahashi |
| 2014/0204687 A1 | 7/2014 | Sinangil |
| 2015/0213881 A1 | 7/2015 | Rai |

FOREIGN PATENT DOCUMENTS

| | | |
|---|---|---|
| TW | 201327559 A1 | 7/2013 |
| TW | 201443909 A | 11/2014 |

* cited by examiner

SRAM MODULE AND WRITING CONTROL METHOD THEREOF

CROSS REFERENCE TO RELATED APPLICATIONS

This application is a continuation of pending U.S. patent application Ser. No. 14/729,853 filed on Jun. 3, 2015, the disclosure of which is hereby incorporated by reference.

BACKGROUND OF THE INVENTION

1. Field of the Invention

The present invention relates to a static random-access memory (SRAM), especially to a write operation of the SRAM.

2. Description of the Prior Art

FIG. 1 illustrates a circuit of a memory cell of an SRAM. The memory cell 110 includes 6 transistors, where the transistor 112 and the transistor 114 form an inverter, and the transistor 122 and the transistor 124 form another inverter. An output of one of the two inverters is connected to an input of the other inverter so a latch that stores one bit data is formed. These two inverters are coupled to a pair of bit lines 132 and 134 through the transistor 116 and the transistor 126, respectively. The transistor 116 and the transistor 126 are coupled to the word line 140. By controlling the on/off states of the transistor 116 and the transistor 126 via the word line 140, access to the memory cell 110 can be manipulated.

When the memory cell 110 stores a binary data of 1 (supposing that an output Q of one of the two inverters is at a logic high level whereas an output QB of the other inverter is at a logic low level) and a binary data of 0 is about to be written to the memory cell 110, the bit line 132 is at the logic low level whereas the bit line 134 is at the logic high level. When the transistor 116 is on, there is a current flowing through the transistor 112 and the transistor 116 and pulling down the voltage level at the output Q. FIGS. 2A and 2B show voltage variations at the outputs of the inverters during a write operation of the memory cell 110. As shown in FIG. 2A, the transistor 116 and the transistor 126 are on in the interval $T_{WL}$ when the word line is asserted (being at the logic high level). The voltage level at the output Q decreases due to discharge whereas the voltage level at the output QB increases. When the interval $T_{WL}$ is over (the word line being at the logic low level again), the voltage level at the output Q becomes low and the voltage level at the output QB becomes high, which means that the write operation succeeds and therefore the binary data stored in the memory cell 110 changes from 1 to 0. If, however, the discharge current is not great enough, or the pull-up strength of the transistor 112 is too high, the voltage level at the output Q is not able to change from the logic high level to the logic low level in the interval $T_{WL}$, and the voltage level at the output QB is not able to change correspondingly from the logic low level to the logic high level, which means the write operation fails, as shown in FIG. 2B.

SUMMARY OF THE INVENTION

In view of the problems of the prior art, an object of the present invention is to provide an SRAM module and a writing control method of the SRAM module, so as to make an improvement to the prior art.

The present invention discloses a writing control method of an SRAM module. The SRAM module has a plurality of memory cells and a bit line. The writing control method includes steps of: providing a first voltage level as a supply voltage to the memory cells during a data retention time of the memory cells; decreasing the first voltage level corresponding to data retention of the memory cells to a second voltage level by discharging the memory cells; and performing a write procedure to the memory cells through the bit line. A discharge time from the first voltage level to the second voltage level is related to the number of the memory cells.

The present invention also discloses an SRAM module. The SRAM module has a plurality of memory cells and comprises: a bit line; an actuating unit and a voltage decreasing unit. The bit line is coupled to the memory cells, and utilized for transmitting a write data. The actuating unit is coupled to the bit line, and utilized for providing a first voltage level as a supply voltage to the memory cells during a data retention time of the memory cells. The voltage decreasing unit is coupled to the bit line and utilized for decreasing the first voltage level corresponding to data retention of the memory cells to a second voltage level by discharging the memory cells. A discharge time from the first voltage level to the second voltage level is related to the number of the memory cells.

The present invention also discloses a writing control method of an SRAM module, the SRAM module having a plurality of memory cells and a bit line. The writing control method comprises: generating an enable signal; generating a control signal according to a characteristic value related to the number of the memory cells; generating a voltage difference according to the enable signal and the control signal; and applying the voltage difference to the bit line to cause a voltage drop on the bit line.

The present invention also discloses an SRAM module, the SRAM module having a plurality of memory cells and a bit line. The SRAM module comprises: a signal generator, for generating an enable signal; a detection unit, for generating a control signal according to a characteristic value related to the number of the memory cells; a voltage difference generator, for generating a voltage difference according to the enable signal and the control signal; and a capacitor, for applying the voltage difference to the bit line to cause a voltage drop on the bit line.

A SRAM module and a writing control method of the SRAM module of the present invention adaptively decreases a voltage of memory cells and applies a voltage drop to the bit line in order to enhance a reliability of the write operation. In comparison with the prior art, the voltage adjustment in the present invention is flexible in accordance with a size of a memory cell array.

These and other objectives of the present invention will no doubt become obvious to those of ordinary skill in the art after reading the following detailed description of the preferred embodiment that is illustrated in the various figures and drawings.

DETAILED DESCRIPTION

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The present invention discloses an SRAM module and its writing control method. Each of the devices can be carried out with components or steps equivalent to those described in this specification by those of ordinary skill in the art as long as the consequent implementation is practicable. In consideration of that some elements themselves in the present invention could be known, the detail of such elements are omitted provided that this omission does not dissatisfy the disclosure and enablement requirements.

Figure 1:
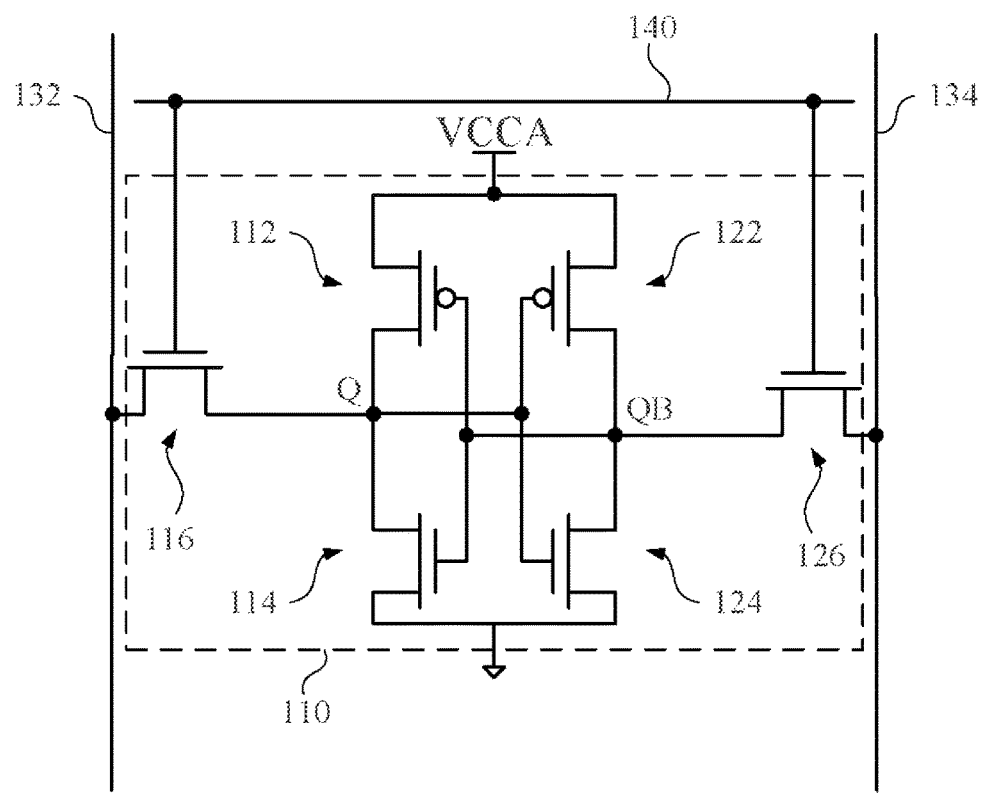
FIG. 1 illustrates a circuit of a memory cell of an SRAM.
Figure 2A:
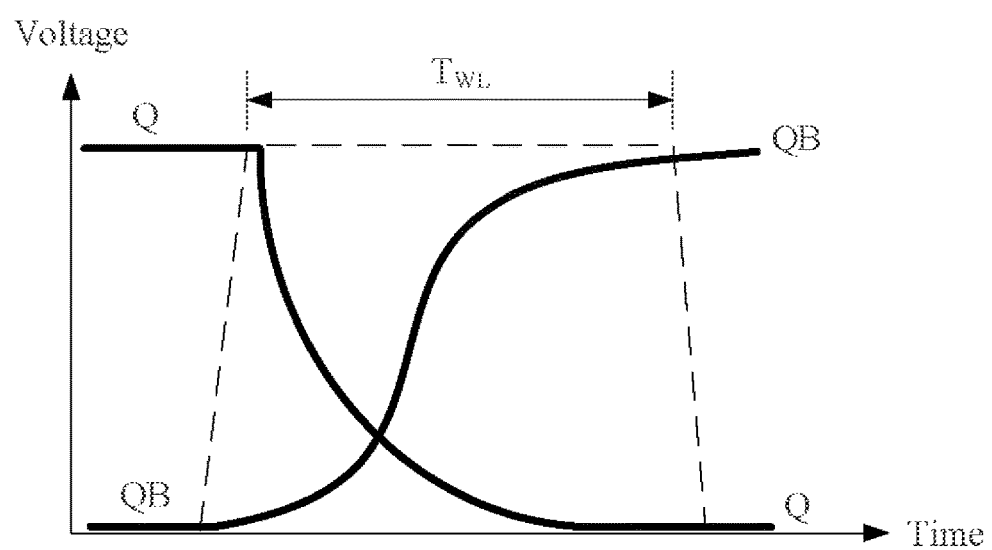
FIGS. 2A and 2B illustrate the voltage changes at the outputs of the inverters during the write operation of the memory cell.
Figure 2B:
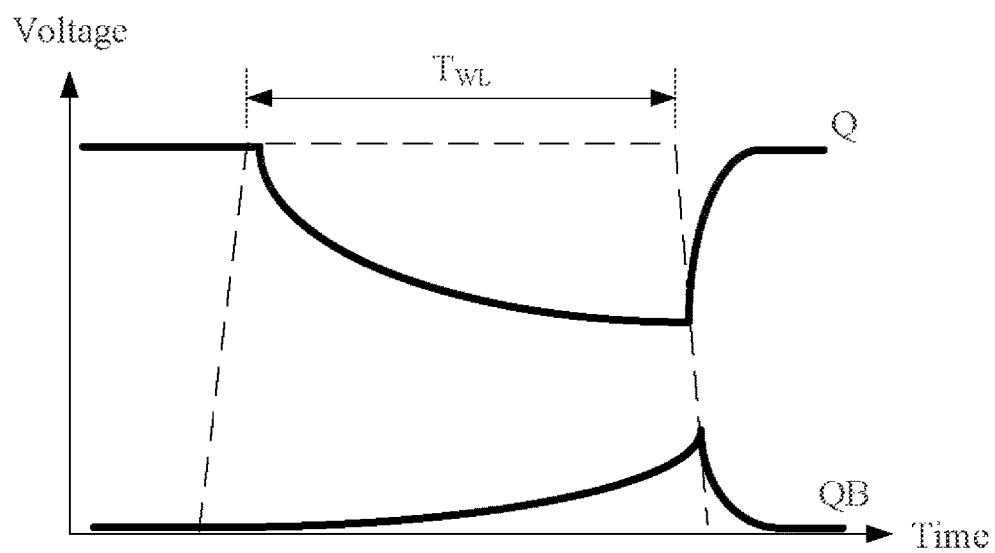
Figure 3:
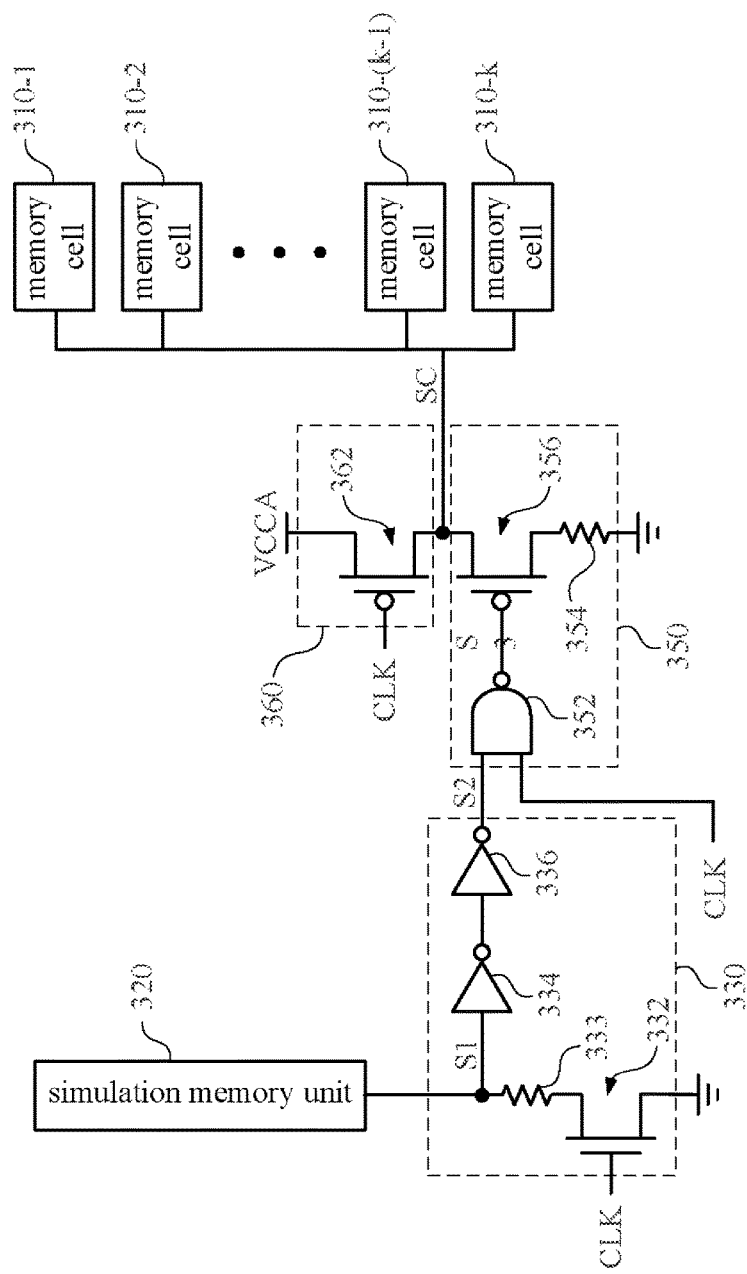
FIG. 3 illustrates a circuit of an SRAM module according to an embodiment of the present invention.

FIG. 3 illustrates a circuit of an SRAM module according to an embodiment of the present invention. In general, an SRAM module includes a memory cell array made up of a plurality of memory cells. The k (k being an integer) memory cells 310-1~310-k stand for one column of the memory cell array and are connected to the same pair of bit lines. Each memory cell 310 is coupled to a voltage source VCCA through an actuating unit 360 so a latch of each memory cell 310 can be powered by the voltage source VCCA. The simulation memory unit 320 can be used to trace the number of the memory cells 310 in one column of the memory cell array. For example, if the SRAM module is a memory complier or an SRAM compiler, the size of the memory cell array is adjustable and the size of the simulation memory unit 320 is proportional to the number of the memory cells 310 in one column of the memory cell array. Thereby, a control unit (not shown) of the SRAM module is able to adjust control parameters of the SRAM module according to the size of the simulation memory unit 320. The simulation memory unit 320 can be made up of dummy memory cells that have the same structure as the memory cells 310, or can simply use a metal line such as a replica bit line to simulate, or can even be made up of a number of PN junctions that is proportional to the number of the memory cells 310. The control unit is able to obtain information of the size of the memory cell array by detecting variations in the resistance and/or the capacitance of the simulation memory unit 320.

The detection unit 330 which is coupled to the simulation memory unit 320 detects a characteristic value of the simulation memory unit 320. The characteristic value can be the resistance or the capacitance mentioned above. The detection unit 330 includes a switch 332, a resistor 333, and two serially-connected inverters 334 and 336. The detection unit 330 is coupled to the discharge unit 350. The discharge unit 350 decides when to form a discharge path according to the output of the detection unit 330, i.e., the control signal S2, and an enable signal CLK. When the discharge path is formed, the equivalent capacitor of the memory cells 310 discharges along the discharge path, which makes the voltage levels on related nodes of the memory cells 310 decrease; namely, the level of the supplied voltage or the storage voltage of the latch of the memory cells 310 decreases.

Figure 4:
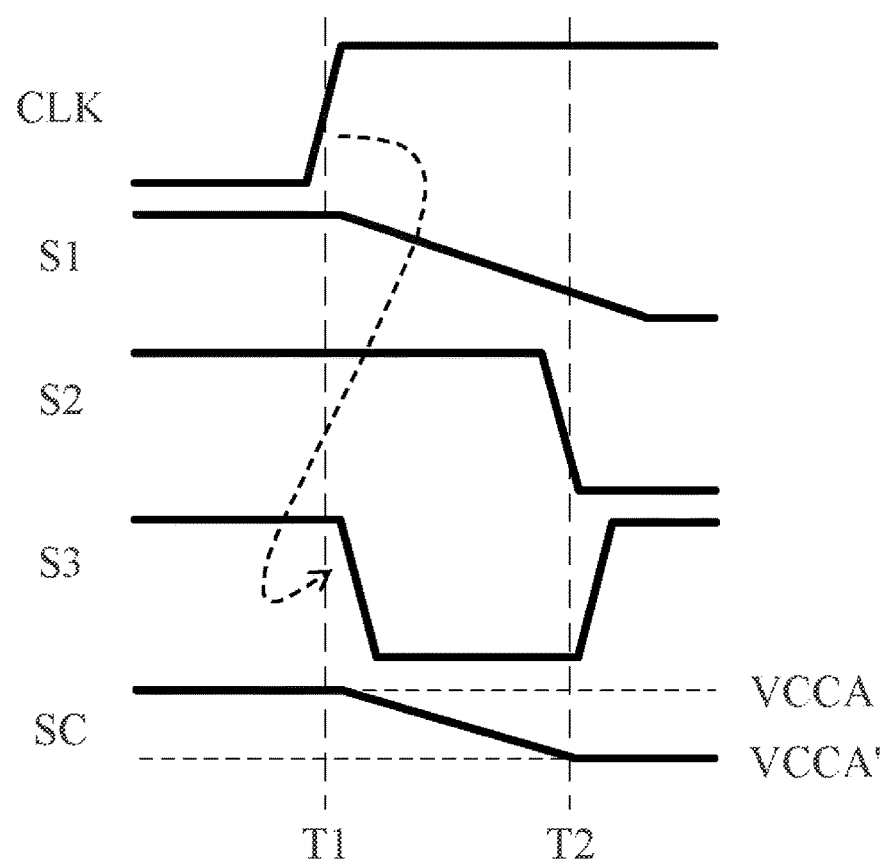
FIG. 4 illustrates a timing diagram corresponding to the signals of the SRAM module in FIG. 3.

FIG. 4 is a timing diagram corresponding to the signals of the SRAM module in FIG. 3. The switch 332 switches on and off according to the enable signal CLK. Before the switch 332 is on (i.e., when the enable signal CLK is at the logic low level), the actuating unit 360 is activated (the switch 362 being on) while the discharge unit 350 is not activated (the switch 356 being off). At the time, the memory cells 310 are coupled to the voltage source VCCA through the actuating unit 360, and therefore the supplied voltage of the latch of each memory cell 310 is at a level of VCCA (i.e., in a data-retaining state). Further, the equivalent capacitor of the simulation memory unit 320 is pre-charged to a logic high level at the time (i.e., the node S1 is at the logic high level), and the control signal S2 is also at the logic high level.

The logic-high control signal S2 and the logic low enable signal CLK make the signal S3 at the output of the NAND gate 352 be at the logic high level, which deactivated the discharge unit 350 (the switch 356 being off) so the voltage of the memory cells 310 remains at the level of VCCA. At time T1, the enable signal CLK transits, deactivating the actuating unit 360 and causing the signal S3 to transit from the logic high level to the logic low level, which thereby activates the discharge unit 350. As a result, the memory cells 310 do not receive the supplying power from the voltage source VCCA anymore and discharge along a discharge path where the resistor 354 resides. Because the memory cells 310 have capacity effects, when it is in the data-retaining state, the equivalent capacitor of each memory cell 310 is charged to the level of VCCA. When the discharge unit 350 is activated, each memory cell 310 discharges along the same discharge path. On the other hand, when the enable signal CLK transits from the logic low level to the logic high level, the switch 332 is on so the equivalent capacitor of the simulation memory unit 320 starts to discharge as well, which means the level of the signal S1 starts to decrease. The control signal S2 transits at time T2 when the signal S1 reaches a threshold value of the inverter 334. The signal S3 also transits at the time when the enable signal CLK is at the logic high level and the control signal S2 is at the logic low level, which deactivates the discharge unit 350 and causes the memory cells 310 to stop discharging. During the process, the voltage on the memory cells 310 (namely, the voltage at the node SC) decreases from VCCA to VCCA'. A lower voltage can weaken the pull-up current (namely, the PMOS current) in the memory cell 310, and therefore the reliability of the write operation can be enhanced. The size of the switch 356 can be designed identical or close to that of the PMOS of the memory cell 310 (i.e., both having the same or similar aspect ratio) to simulate the pull-up strength of the PMOS of the memory cell 310. To be specific, if the PMOS of the memory cell 310 has a stronger pull-up strength, the switch 356 is able to provide a discharge path with a greater current to pull the voltage level at the node SC lower. In different embodiments, the switch 356 can be implemented by a transmission gate.

Figure 5:
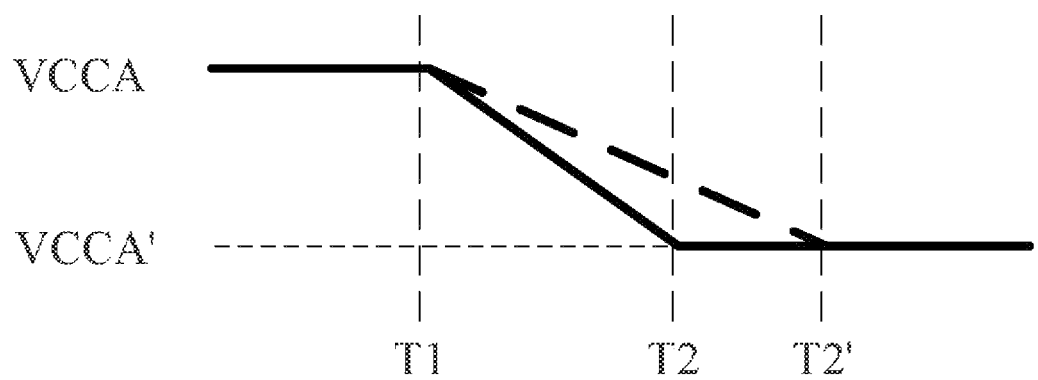
FIG. 5 illustrates a discharge time of the capacitor.

In theory, a lower voltage VCCA' results in a more reliable write operation; nevertheless, this voltage must not be too low in case the memory cells 310 need to retain the data stored while not in the write operation. It should be noted that all the memory cells 310 are practically connected in parallel, and the greater k is, the greater the equivalent capacitance of parallel capacitors is. For the same discharge current, larger capacitors need more time to achieve the same voltage drop (VCCA-VCCA'). On the other hand, the equivalent capacitance of the simulation memory unit 320 is proportional to k; the greater k is, the greater the equivalent capacitance of the simulation memory unit 320 is. In other words, if k is greater, the elapsed time from the signal S1 starting to decrease to reaching the threshold value (namely, T2-T1) is longer. Therefore, this invention is able to automatically adjust the discharge time of the memory cells 310 according to the size of the memory cell array of the SRAM module, which is proportional to k. As shown in FIG. 5, when k is smaller (corresponding to a smaller memory cell array), both the equivalent capacitor of the simulation memory unit 320 and the equivalent capacitor of the parallel memory cells 310 have a faster discharge speed (solid line); in contrast, when k is greater (dashed line), the circuit of this invention automatically provides longer discharge time (namely, T2'-T1). Thus, in spite of the size of the memory cell array, the memory cells 310 can practically achieve the same voltage drop.

When the voltage at the memory cells 310 drops to the target voltage level VCCA', the write procedure of the memory cells 310 can be carried out more smoothly. Therefore, in FIG. 4, the time to turn on the word line can be at or after T2; however, the word line can also be turned on before T2, for example, as early as T1, to start the write procedure. Furthermore, after the write procedure is completed (the word line being off), the enable signal CLK is controlled to transit from the logic high level to the logic low level in order that the switch 332 of the detection unit 330 and the switch 356 of the discharge unit 350 are turned off and the switch 362 of the actuating unit 360 is turned on. As a result, the voltage at the memory cells 310 will again increase to VCCA, which makes the memory cells 310 have a higher supply voltage to retain data and lowers the risk of data loss.

Figure 6:
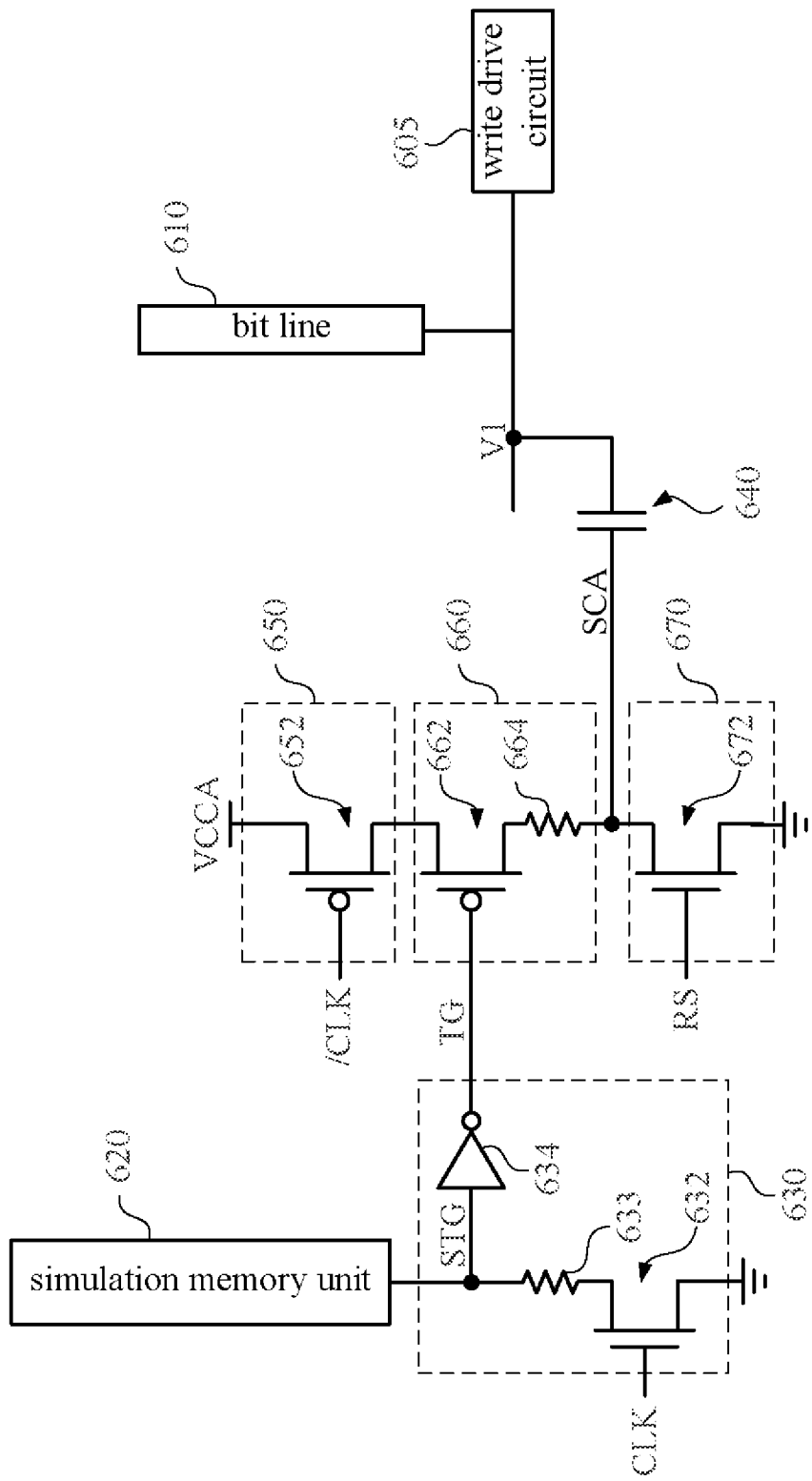
FIG. 6 illustrates a circuit of an SRAM module according to another embodiment of the present invention.

FIG. 6 illustrates a circuit of an SRAM module according to another embodiment of the present invention. In the write procedure of the memory cell, the write drive circuit 605 sends the data to be written through the bit line 610 by controlling a voltage level on the bit line 610. The bit line 610 is coupled to the reset unit 670 and the charge unit 660 through the capacitor 640. The actuating unit 650 is coupled between the voltage source VCCA and the charge unit 660. The charge unit 660 is further coupled to the detection unit 630. The detection unit 630 detects the size of the simulation memory unit 620 and outputs a control signal TG to control the charge unit 660. The charge unit 660 includes a switch 662 and a resistor 664. The switch 662 switches on and off according to the control signal TG. The actuating unit 650 and the reset unit 670 respectively include a switch 652 and a switch 672, which switch on and off according to an inverse of the enable signal CLK and a signal RS, respectively. The detection unit 630 includes a switch 632, a resistor 633 and an inverter 634. The switch 632 switches on and off according to the enable signal CLK. When the switch 632 is on, the equivalent capacitor of the simulation memory unit 620 discharges through the resistor 633, and a voltage level at the input terminal of the inverter 634 (namely, the voltage level at the node STG) decreases during the discharge process. The capacitor 640 can be implemented, for example, by a MOS capacitor. The operation of this circuit is detailed below by referring to a timing diagram of each signal.

Figure 7:
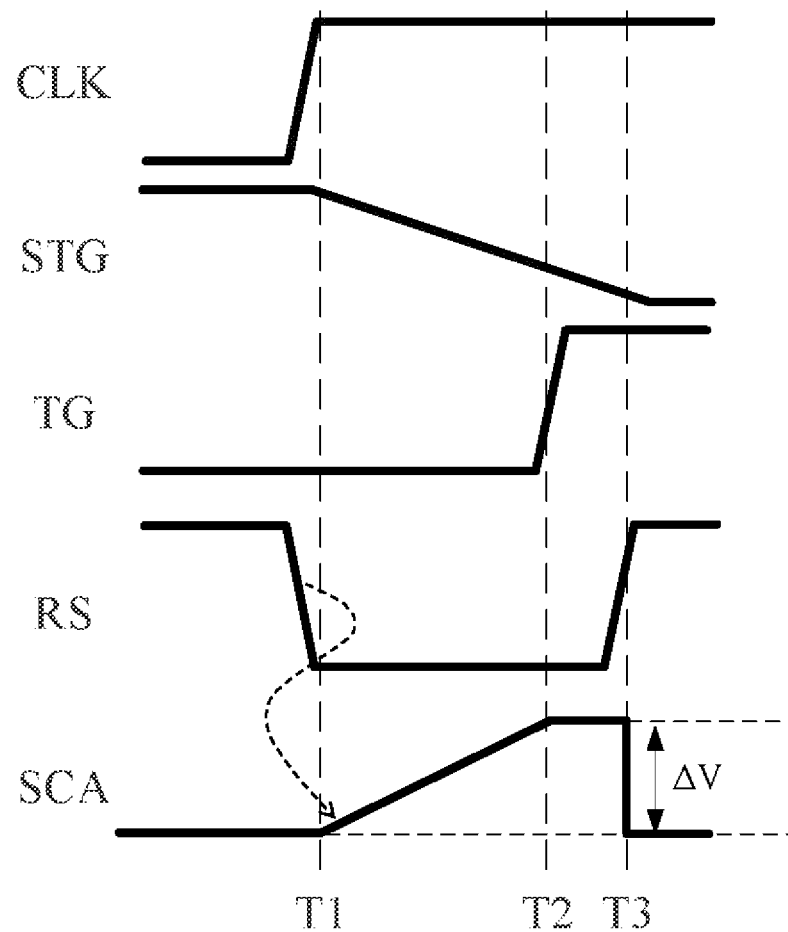
FIG. 7 illustrates a timing diagram corresponding to the signals of the SRAM module in FIG. 6.

FIG. 7 is a timing diagram corresponding to the signals of the SRAM module in FIG. 6. When the enable signal CLK is low, the switch 632 and the switch 652 are off, and the equivalent capacitor of the simulation memory unit 620 has not started to discharge yet; meanwhile the node STG is at the logic high level and the actuating unit 650 is deactivated to ensure that the charge unit 660 does not charge the capacitor 640. On the other hand, when the enable signal CLK is at the logic low level, the signal RS is at the logic high level, which makes one end of the capacitor 640 connect to ground (namely, the level at the node SCA being 0). At time T1, the enable signal CLK transits from the logic low level to the logic high level and the switch 632 switches on accordingly, which makes the equivalent capacitor of the simulation memory unit 620 discharge through the resistor 633. Further, the logic-high enable signal CLK activates the actuating unit 650 (the switch 652 being on) and the transition of the signal RS from the logic high level to the logic low level deactivates the reset unit 670 (the switch 672 being off). At the time, the logic-low control signal TG also activates the charge unit 660 (the switch 662 being on), and therefore the voltage source VCCA starts to charge the capacitor 640 through the resistor 664.

From T1 to T2, the voltage level at the node STG continues to decrease whereas the voltage level at the node SCA continues to increase. When the voltage level at the node STG is below a threshold value of the inverter 634 (at time T2), the control signal TG transits from the logic low level to the logic high level, which deactivates the charge unit 660 (the switch 662 being off). Therefore, after time T2, the charge unit 660 stops charging the capacitor 640 so the voltage level at the node SCA remains constant. As a result, the capacitor 640 gains a voltage increase of $\Delta V$ during the time interval from T1 to T2. At time T3, the signal RS transits from the logic low level to the logic high level, which activates the reset unit 670 again (switch 672 being on). The switch 672 is switched on to force the voltage level at the node SCA to be 0, and thus a voltage difference at two ends of the capacitor 640 causes a voltage drop on the node V1. In the subsequent write operation where a binary data 0 is to be written, a low voltage on the bit line 610 provided by the write drive circuit 605 will be forced to drop by $\Delta V$; therefore, the bit line 610 has an even lower voltage to enhance the pull-down current so as to overcome the pull-up current of the memory cell and smoothen the procedure of writing binary data 0. Similar to the prior embodiment, the size of the switch 662 can be identical to that of the PMOS of the memory cell.

Figure 8:
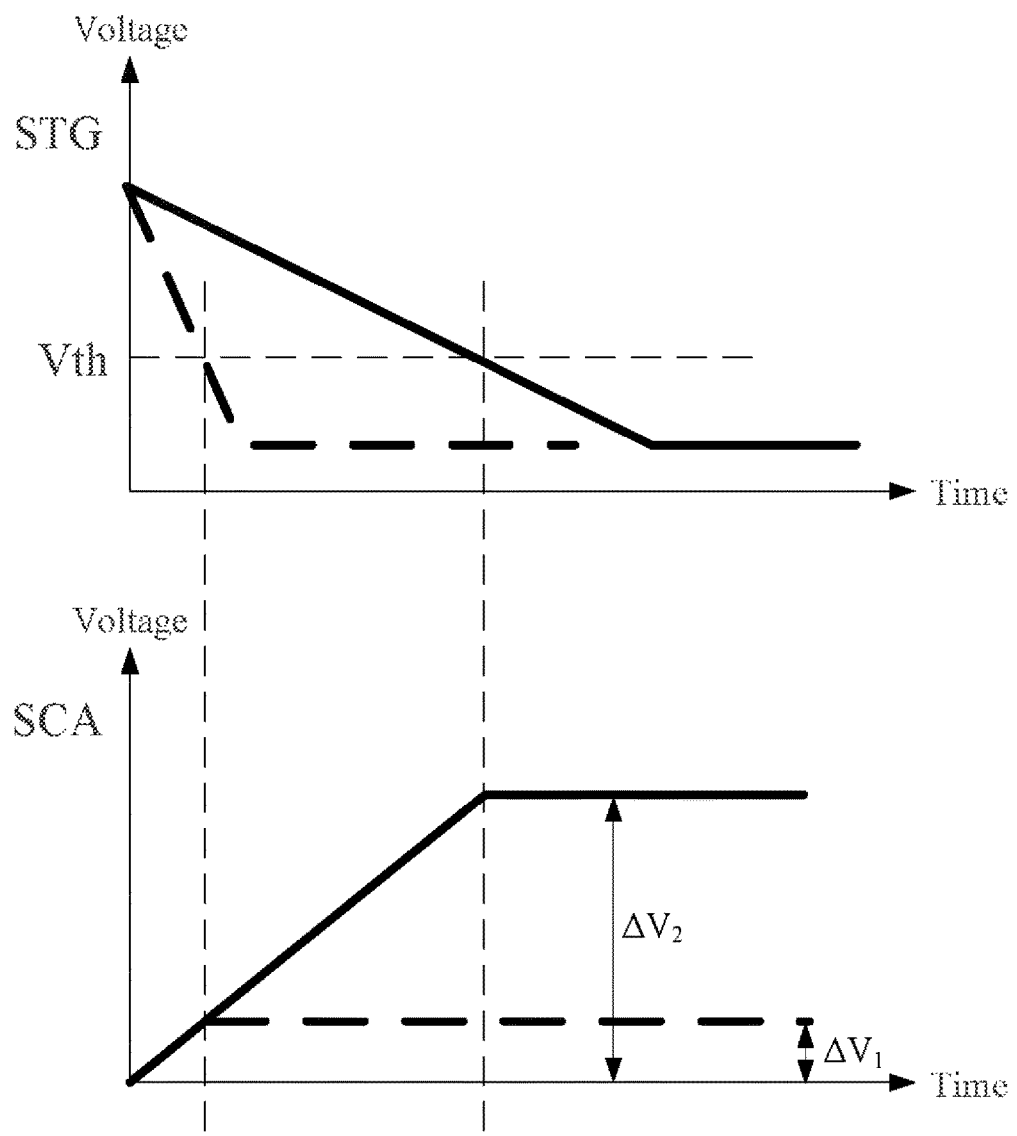
FIG. 8 illustrates a charge time and a discharge time of capacitors.

The voltage difference on the capacitor 640 is related to a discharge time of the equivalent capacitor of the simulation memory unit 620; in other words, it is somehow related to a slope of the change of the voltage level at the node STG between T1 and T2. If the equivalent capacitor of the simulation memory unit 620 is greater, which implies that the simulation memory unit 620 has more dummy memory cells or longer metal lines (the number of dummy memory cells or the length of the metal line being proportional to the number of memory cells connected to the bit line 610, namely, proportional to a length of the bit line 610), the voltage level at the node STG decreases more slowly, which delays the transition time (T2) of the control signal TG and the capacitor 640 turns out to have a longer charge time. As shown in FIG. 8, when the voltage level at the node STG decreases more rapidly (the dashed line), the capacitor 640 gains a less voltage difference ($\Delta V_1$); on the contrary (the solid line), the capacitor 640 gains a greater voltage difference ($\Delta V_2$). In other words, the voltage difference gained by the capacitor 640 is proportional to the size of the simulation memory unit 620, namely, proportional to the number of memory cells connected to the bit line 610. When the bit line 610 is longer, which implies that there are more memory cells connected thereto, the bit line 610 requires a lower voltage to overcome more pull-up transistors that are connected thereto. In summary, the SRAM module in FIG. 6 is able to adaptively provide different negative voltages on the bit line 610 according to the length of the bit line 610. The voltage difference $\Delta V$ on the capacitor 640 can be expressed as:

$$\Delta V = \frac{C_{bl}}{C_{bl} + C_{ca}} VCCA$$

where $C_{b1}$ is an equivalent capacitance of the bit line 610, and $C_{ca}$ is the capacitance of the capacitor 640. When the bit line 610 gets longer (i.e., $C_{b1}$ being greater), the voltage difference on the capacitor 640 becomes larger accordingly. Thus, this invention can be applied to a memory compiler; when the number of memory cells changes, a negative voltage applied to the bit line 610 can be adaptively adjusted to improve the reliability of the write procedure. Adjusting a voltage drop on the bit line 610 in an adaptive manner also helps reduce power consumption; this is because that if a constant voltage drop is applied to various bit lines 610 with different lengths, this constant voltage drop must be designed greater, which leads to more power consumption.

Figure 9:
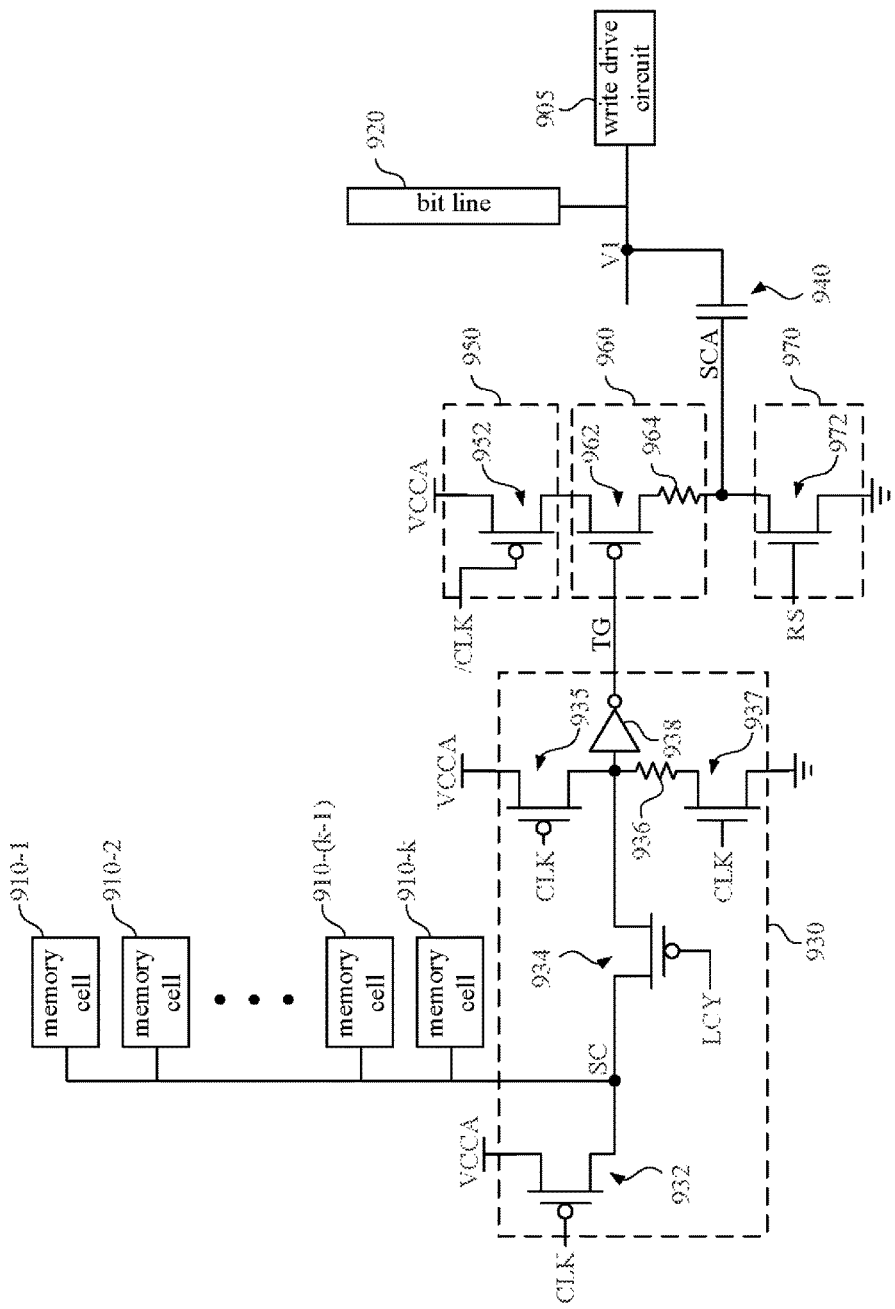
FIG. 9 illustrates a circuit of an SRAM module according to another embodiment of the present invention.
Figure 10:
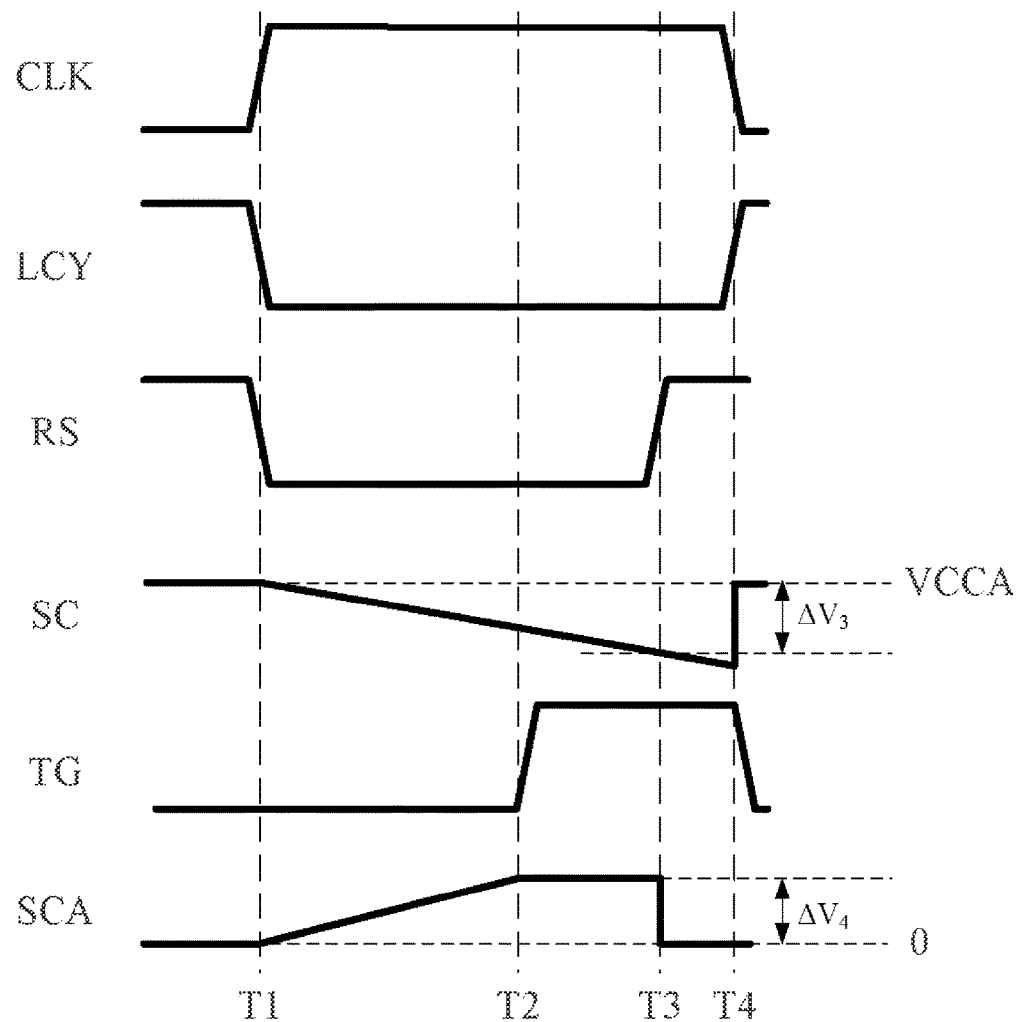
FIG. 10 illustrates a timing diagram corresponding to the signals of the SRAM module in FIG. 9.

FIGS. 9 and 10 show a circuit and its corresponding timing diagram of an SRAM module according to another embodiment of the present invention. In this embodiment, memory cells 910-1~910-k are actually connected to the bit line 920. When the enable signal CLK transits from the logic low level to the logic high level, the switch 932 of the detection unit 930 is off, which prevents the voltage source VCCA from being coupled to the memory cells 910-1~910-k. A logic-high enable signal CLK also causes the switch 935 to switch off and the switch 937 to switch on. Meanwhile, the signal LCY transits from the logic high level to the logic low level, which causes the switch 934 to switch on. As a result, the memory cells 910 start to discharge through the resistor 936, and the off state of the switch 935 allows the input terminal of the inverter 938 to reflect a voltage change of the memory cells 910, namely, a level change at the node SC. The logic-high enable signal CLK activates the actuating unit 950 (the switch 952 being on); the signal RS also transits from the logic high level to the logic low level at T1, which deactivates the reset unit 970 (the switch 972 being off). As a result, the voltage level at the node SC starts to decrease at time T1 and meanwhile the voltage source VCCA charges the capacitor 940 through the switch 952, the switch 962 and the resistor 964, which makes the voltage level at the node SCA increase gradually. Similar to the prior embodiment, the size of the switch 962 can be identical to that of the PMOS of the memory cell 910.

When a voltage level at the node SC becomes lower than a threshold value of the inverter 938 (occurring at T2), the control signal TG (i.e., the output signal of the detection unit 930) transits, which deactivates the charge unit 960. As the charge path is closed, the voltage level at the node SCA stops increasing. At time T3 when the signal RS transits from the logic low level to the logic high level, which activates the reset unit 970 again, the voltage level at the node SCA drops to 0V accordingly; as a result, a voltage difference $\Delta V_4$ on the capacitor 940 generates a negative voltage on the node V1 and thus the voltage level on the bit line 920 is pulled down to smoothen the write procedure. After the write procedure finishes, the enable signal CLK and the signal LCY transit at time T4 and therefore the memory cells 910 receive the voltage VCCA again. In the write procedure, the supplied voltage or the storage voltage on the memory cells 910 has a voltage drop of at least $\Delta V_3$, which weakens the pull-up current in the memory cells 910. The switches in the embodiments above can be implemented by transistors, but this is not a limitation to this invention. The resistors in FIGS. 3, 6 and 9 can be omitted, and the function of this invention will not be affected.

In this embodiment, a decrease speed of the voltage level at the node SC is proportional to the equivalent capacitance of the parallel memory cells 910. A larger k means a greater equivalent capacitance of the parallel capacitors and a slower decrease speed of the voltage level at the node SC; therefore, the capacitor 940 has a longer charge time, which implies that the voltage level at the node SCA will be greater after charge. In summary, a magnitude of voltage drop at the bit line 920 is proportional to k, namely, proportional to the size of the memory cell array of the SRAM module. A larger array implies that the voltage level at the bit line 920 should be lower to overcome more pull-up transistors connected to the bit line 920.

Figure 11:
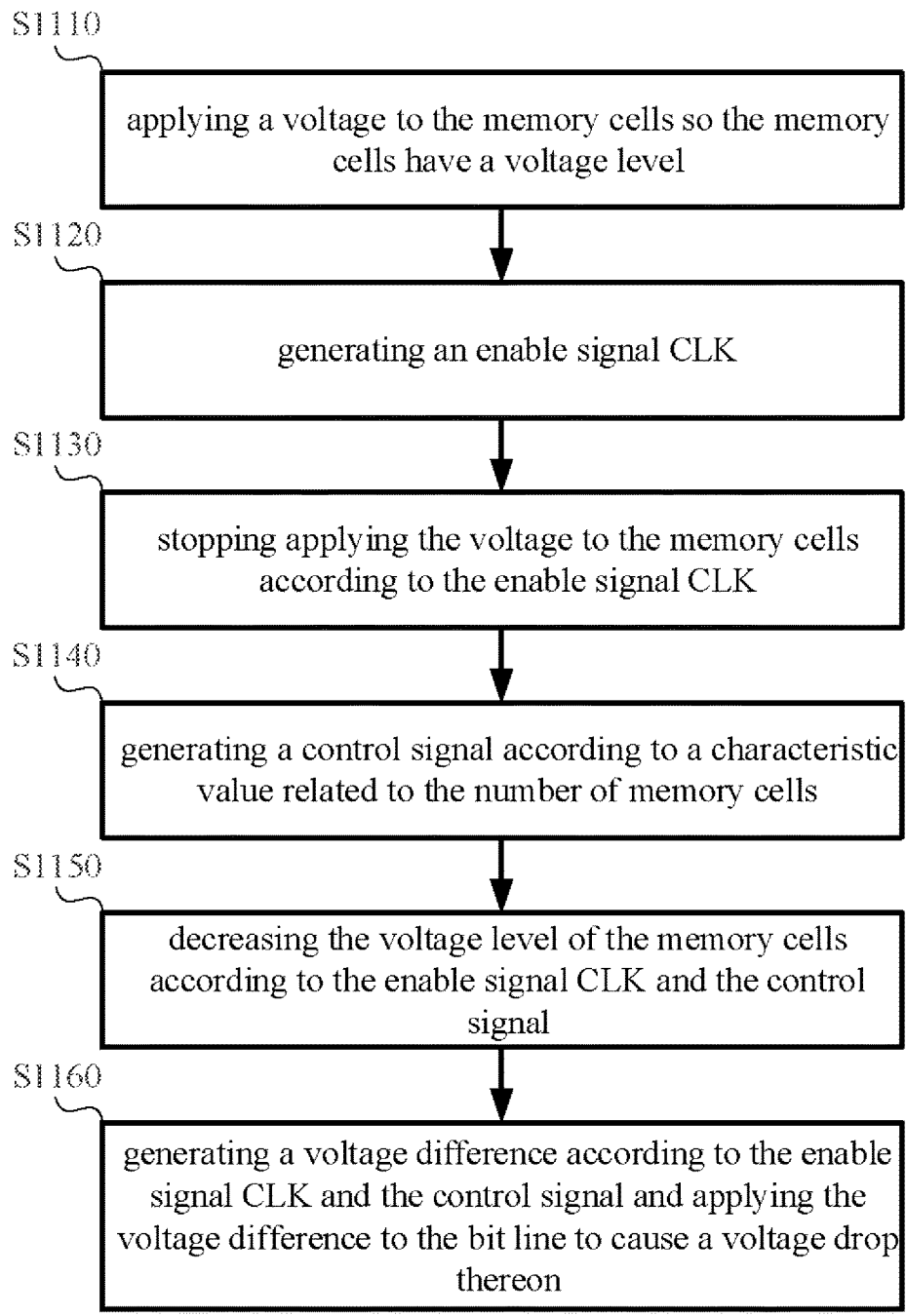
FIG. 11 illustrates a flowchart of a writing control method of an SRAM module according to an embodiment of the present invention.

FIG. 11 shows a flowchart of a writing control method of an SRAM module according to an embodiment of the present invention. The SRAM module includes a plurality of memory cells and at least one bit line for transmitting write data. The method includes the following steps:

Step S1110: applying a voltage to the memory cells so the memory cells have a voltage level. Memory cells of the SRAM store data and the voltage level is used to retain the data stored. This state is referred to as a data retention time of the memory cells;

Step S1120: generating an enable signal CLK. The enable signal CLK is related to a write procedure of the SRAM module. The enable signal CLK is enabled before or during the write procedure;

Step S1130: stopping applying the voltage to the memory cells according to the enable signal CLK;

Step S1140: generating a control signal according to a characteristic value related to the number of memory cells. The characteristic value can be an equivalent capacitance of the simulation memory unit 320 in FIG. 3 or the simulation memory unit 620 in FIG. 6. Because the size of the simulation memory unit 320 or the simulation memory unit 620 is related to the number of the memory cells 310 or the length of the bit line 610, (the length of the bit line 610 being directly proportional to the number of memory cells connected thereto), the equivalent capacitance is actually related to the number of the memory cells;

Step S1150: decreasing the voltage level of the memory cells according to the enable signal CLK and the control signal in order to weaken a driving capability of a transistor of the memory cells. Specifically, this transistor can be a PMOS of the memory cells, which is coupled to the voltage level. A decrease in the voltage level weakens the driving capability of the PMOS, which smoothens a write procedure of the SRAM module; and Step S1160: generating a voltage difference according to the enable signal CLK and the control signal and applying the voltage difference to the bit line to cause a voltage drop thereon. Because the control signal is related to the characteristic value, the magnitude of the voltage drop is proportional to the characteristic value as well. Specifically, the voltage drop on the bit line varies in accordance with the number of the memory cells. The adaptive voltage drop can further improve the reliability of the write operation.

The simulation memory unit 320 and the simulation memory unit 620 are also originally connected to a voltage source and are provided with another voltage level. The voltage source may or may not be the voltage source of the memory cells. The step S1140 has the following sub-steps: stopping connecting the simulation memory unit 320 or the simulation memory unit 620 to the voltage source according to the enable signal CLK, and generating the control signal according to a variation of the another voltage level. The related timing diagrams are depicted in FIGS. 4, 5, 7 and 8. Because the change in the voltage level is related to the equivalent capacitance of the simulation memory unit 320 or the simulation memory unit 620, the control signal is also related to the characteristic value.

Figure 12:
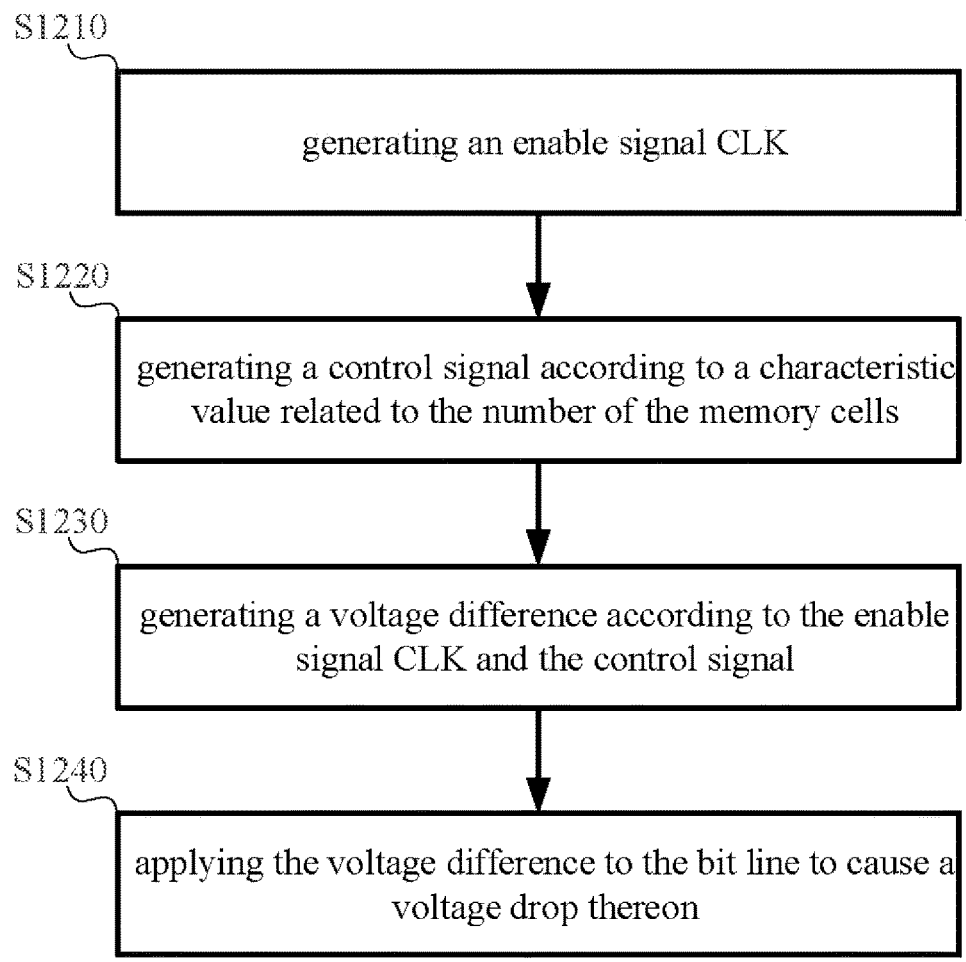
FIG. 12 illustrates a flowchart of a writing control method of an SRAM module according to another embodiment of the present invention.

FIG. 12 shows a flowchart of a writing control method of an SRAM module according to another embodiment of the present invention. The method includes the following steps:

Step S1210: generating an enable signal CLK. The enable signal CLK is related to a write procedure of the SRAM module. The enable signal CLK is enabled before or during the write procedure;

Step S1220: generating a control signal according to a characteristic value related to the number of the memory cells. This characteristic value can be an equivalent capacitance of the simulation memory unit 620 in FIG. 6 or an equivalent capacitance of the memory cells 910 in FIG. 9. For the situation in FIG. 6, because the equivalent capacitance of the simulation memory unit 620 is related to the length of the bit line 610, the equivalent capacitance is actually related to the number of the memory cells; for the situation in FIG. 9, the equivalent capacitance is directly related to the number of the memory cells;

Step S1230: generating a voltage difference according to the enable signal CLK and the control signal. The voltage difference can be generated by a charged capacitor. A charge time for the capacitor is related to the control signal. The details are illustrated in FIGS. 7, 8 and 10; and Step S1240: applying the voltage difference to the bit line to cause a voltage drop thereon. A negative voltage is generated at one end of the capacitor by connecting the other end of the capacitor that has a higher voltage level to the ground. The negative voltage results in the voltage drop on the bit line coupled to the capacitor. Because the control signal is related to the characteristic value, the magnitude of the voltage difference is also proportional to the characteristic vale. Specifically, the voltage drop on the bit line varies with the number of the memory cells.

The detailed operation of the step S1220 can be similar or identical to that of the step S1140 or can be designed to decrease a voltage level of the memory cells and detect a change in the voltage level to generate the control signal. The detailed operation includes the steps S1110 and S1130, where the voltage level of the memory cells is decreased according to the enable signal CLK after the voltage is stopped from being applied to the memory cells, and the control signal is generated by detecting a change in the voltage level. In the processes illustrated by FIGS. 11 and 12, the enable signal CLK can be generated before or during the write procedure of the SRAM; i.e., the aforementioned voltage drop step (such as a decrement in the voltage level of the memory cells in the step S1150 or the voltage drop on the bit line in the steps S1160 and S1240) can be performed before the write procedure or performed concurrently with the write procedure.

Since people of ordinary skill in the art can appreciate the implementation detail and the modification thereto of the method invention of FIG. 11 through the disclosure of the device invention of FIGS. 3~8, and the method invention of FIG. 12 through the disclosure of the device invention of FIGS. 6~10, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An SRAM module, the SRAM module having a plurality of memory cells, comprising:
    a bit line, coupled to the memory cells, for transmitting a write data;
    an actuating unit, coupled to the bit line, for providing a first voltage level as a supply voltage to the memory cells during a data retention time of the memory cells; and
    a voltage decreasing unit, coupled to the bit line, for decreasing the first voltage level corresponding to data retention of the memory cells to a second voltage level by discharging the memory cells;
    wherein, a discharge time from the first voltage level to the second voltage level is related to the number of the memory cells.

2. The SRAM module of claim 1 further comprising:
    a capacitor, coupled to the bit line, wherein the voltage decreasing unit, coupled the capacitor, for generating a voltage difference on the capacitor, thereby to couple the voltage difference to the bit line to cause a voltage drop.

3. The SRAM module of claim 2, wherein the magnitude of the voltage difference is directly proportional to the number of the memory cells.

4. The SRAM module of claim 2, wherein an end of the capacitor is coupled to the bit line, and the voltage decreasing unit is utilized to couple the other end of the capacitor to ground according to a reset signal, thereby to cause the voltage drop on the bit line.

5. The SRAM module of claim 1, wherein the discharge time from the first voltage level to the second voltage level is directly proportional to the number of the memory cells.

6. The SRAM module of claim 5, wherein a voltage difference between the first voltage level and the second voltage level is a predetermined value, which is irrelevant to the number of the memory cells.

7. The SRAM module of claim 1, wherein the actuating unit stops providing the first voltage level to the memory cells before the voltage decreasing unit decreases the first voltage level.

8. A writing control method of an SRAM module, the SRAM module having a plurality of memory cells and a bit line, the writing control method comprising:
   providing a first voltage level as a supply voltage to the memory cells during a data retention time of the memory cells;
   decreasing the first voltage level corresponding to data retention of the memory cells to a second voltage level by discharging the memory cells; and
   performing a write procedure to the memory cells through the bit line;
   wherein, a discharge time from the first voltage level to the second voltage level is related to the number of the memory cells.

9. The writing control method of claim 8 further comprising:
   generating a voltage difference and using a capacitor to couple the voltage difference to the bit line to cause a voltage drop on the bit line.

10. The writing control method of claim 9, wherein the magnitude of the voltage difference is directly proportional to the number of the memory cells.

11. The writing control method of claim 9, wherein an end of the capacitor is coupled to the bit line, and the step of generating the voltage drop is to couple the other end of the capacitor to ground according to a reset signal.

12. The writing control method of claim 8, wherein the discharge time from the first voltage level to the second voltage level is directly proportional to the number of the memory cells.

13. The writing control method of claim 12, wherein a voltage difference between the first voltage level and the second voltage level is a predetermined value, which is irrelevant to the number of the memory cells.

14. The writing control method of claim 1 further comprising:
   stopping providing the first voltage level to the memory cells before decreasing the first voltage level.

15. An SRAM module, the SRAM module having a plurality of memory cells and a bit line, the SRAM module comprising:
   a signal generator, for generating an enable signal;
   a detection unit, for generating a control signal according to a characteristic value related to the number of the memory cells;
   a voltage difference generator, for generating a voltage difference according to the enable signal and the control signal; and
   a capacitor, for applying the voltage difference to the bit line to cause a voltage drop on the bit line.

16. The SRAM module of claim 15, wherein the capacitor is utilized for applying a voltage to the memory cells in order that the memory cells have a voltage level by which the memory cells retain data stored therein; the detection unit is utilized for stopping applying the voltage to the memory cells according to the enable signal; and the voltage difference generator is utilized for decreasing the voltage level of the memory cells according to the enable signal and generating the control signal according to a change in the voltage level.

17. The SRAM module of claim 15, wherein a magnitude of the voltage drop is directly proportional to the number of the memory cells.

18. A writing control method of an SRAM module, the SRAM module having a plurality of memory cells and a bit line, the writing control method comprising:
   generating an enable signal;
   generating a control signal according to a characteristic value related to the number of the memory cells;
   generating a voltage difference according to the enable signal and the control signal; and
   applying the voltage difference to the bit line to cause a voltage drop on the bit line.

19. The writing control method of claim 18 further comprising:
   applying a voltage to the memory cells in order that the memory cells have a voltage level by which the memory cells retain data stored therein;
   wherein the step of generating the control signal according to the characteristic value related to the number of the memory cells comprises:
   stopping applying the voltage to the memory cells according to the enable signal; and
   decreasing the voltage level of the memory cells according to the enable signal and generating the control signal according to a change in the voltage level.

20. The writing control method of claim 18, wherein a magnitude of the voltage drop is directly proportional to the number of the memory cells.

* * * * *